US009118340B2

(12) United States Patent
Shiraishi et al.

(10) Patent No.: US 9,118,340 B2
(45) Date of Patent: Aug. 25, 2015

(54) ANALOG-TO-DIGITAL CONVERTER AND ANALOG-TO-DIGITAL CONVERSION METHOD

(71) Applicant: KABUSHIKI KAISHA TOSHIBA, Tokyo (JP)

(72) Inventors: Kei Shiraishi, Tokyo (JP); Junya Matsuno, Kanagawa (JP); Masanori Furuta, Kanagawa (JP); Tetsuro Itakura, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/548,523

(22) Filed: Nov. 20, 2014

(65) Prior Publication Data

US 2015/0138005 A1   May 21, 2015

(30) Foreign Application Priority Data

Nov. 21, 2013 (JP) ................. 2013-241053

(51) Int. Cl.
*H03M 1/38* (2006.01)
*H03M 1/20* (2006.01)
*H03M 1/12* (2006.01)
*H03M 3/00* (2006.01)

(52) U.S. Cl.
CPC ............. *H03M 1/20* (2013.01); *H03M 1/121* (2013.01); *H03M 1/1245* (2013.01); *H03M 3/472* (2013.01); *H03M 3/496* (2013.01)

(58) Field of Classification Search
CPC ..... H03M 1/0695; H03M 1/44; H03M 1/167; H03M 1/069; H03M 1/12; H03M 1/72
USPC .......................... 341/155, 161–163
See application file for complete search history.

(56) References Cited

U.S. PATENT DOCUMENTS

| 6,295,016 | B1 * | 9/2001 | Chiang | 341/161 |
| 6,366,230 | B1 * | 4/2002 | Zhang et al. | 341/162 |
| 7,030,804 | B2 * | 4/2006 | Yoshioka et al. | 341/172 |
| 7,148,833 | B1 * | 12/2006 | Cho et al. | 341/162 |
| 7,154,426 | B2 * | 12/2006 | Tani et al. | 341/155 |
| 7,265,705 | B1 * | 9/2007 | Lee et al. | 341/162 |
| 7,612,700 | B2 * | 11/2009 | Kawahito et al. | 341/161 |
| 7,924,204 | B2 * | 4/2011 | Chang et al. | 341/161 |

(Continued)

OTHER PUBLICATIONS

Schreier et al., "Understanding Delta-Sigma Data Converters," Wiley, Oct. 2004, pp. 1 and 36-39.

(Continued)

*Primary Examiner* — Linh Nguyen
(74) *Attorney, Agent, or Firm* — Finnegan, Henderson, Farabow, Garrett & Dunner, LLP

(57) ABSTRACT

According to an embodiment, an analog-to-digital converter includes a first AD (analog-to-digital) conversion circuit and a second AD conversion circuit. The first AD conversion circuit performs AD conversion of a first input signal to generate an upper-bit digital signal. The second AD conversion circuit performs AD conversion of a sampled signal to generate a lower-bit digital signal. The sampled signal is obtained by sampling a residual signal corresponding to a residue of the AD conversion in the first AD conversion circuit. A period during which the second AD conversion circuit performs AD conversion of the sampled signal overlaps a period during which a second input signal subsequent to the first input signal is settled.

7 Claims, 11 Drawing Sheets

(56) References Cited

U.S. PATENT DOCUMENTS

| | | | |
|---|---|---|---|
| 8,094,056 B2* | 1/2012 | Nazemi et al. | 341/161 |
| 8,466,823 B2* | 6/2013 | Chio et al. | 341/156 |
| 8,564,469 B2* | 10/2013 | Nam et al. | 341/161 |
| 8,730,073 B1* | 5/2014 | Wang et al. | 341/122 |
| 8,749,415 B2* | 6/2014 | Jung et al. | 341/143 |

OTHER PUBLICATIONS

Seo et al.; "An 80μV$_{rms}$-Temporal-Noise 82dB-Dynamic-Range CMOS Image Sensor with a 13-to-19b Variable-Resolution Column-Parallel Folding-Integration/Cyclic ADC", 2011 IEEE International Solid-State Circuits Conference, ISSCC 2011, Session 23, Image Sensors, 23.1, pp. 400-401 and ISSCC 2011 Paper Continuations (1 page), (2011).

Kim et al.; "A 14b Extended Counting ADC Implemented in a 24MPixel APS-C CMOS Image Sensor", 2012 IEEE International Solid-State Circuits Conference, ISSCC 2012, Session 22, Image Sensors, 22.6, pp. 390-391 and ISSCC 2012 Paper Continuations (1 page), (2012).

* cited by examiner

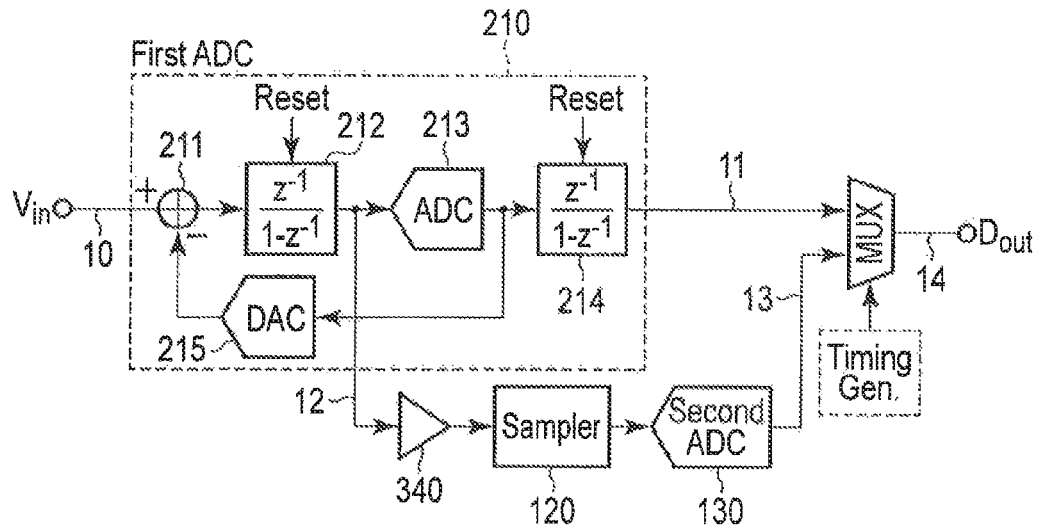
F I G. 5
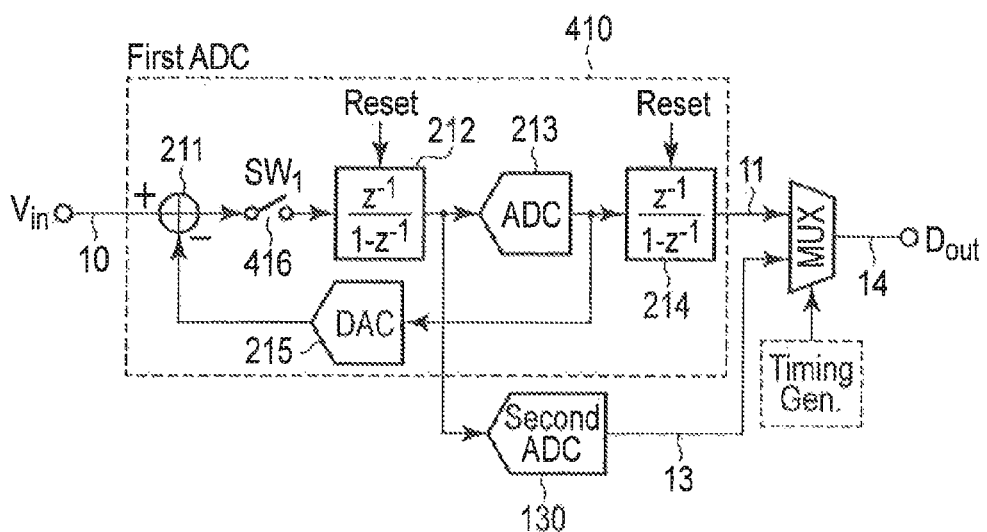
F I G. 6

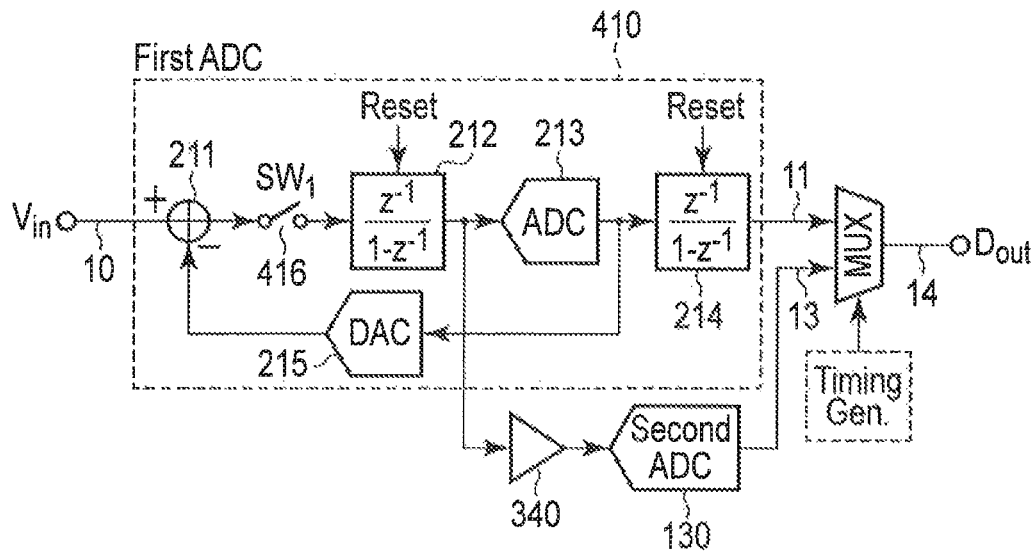
F I G. 8
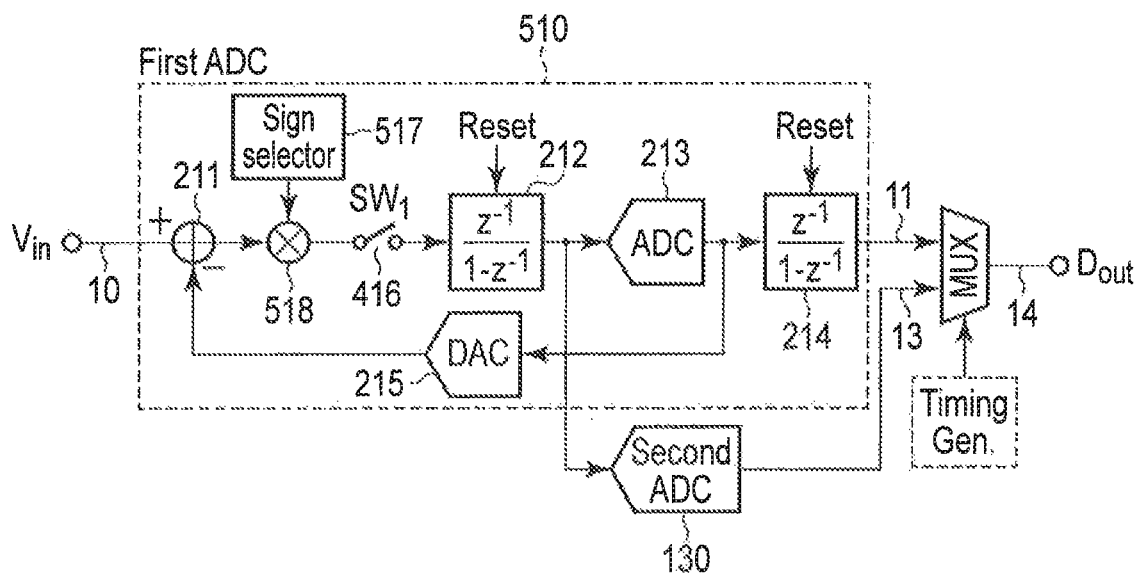
F I G. 9

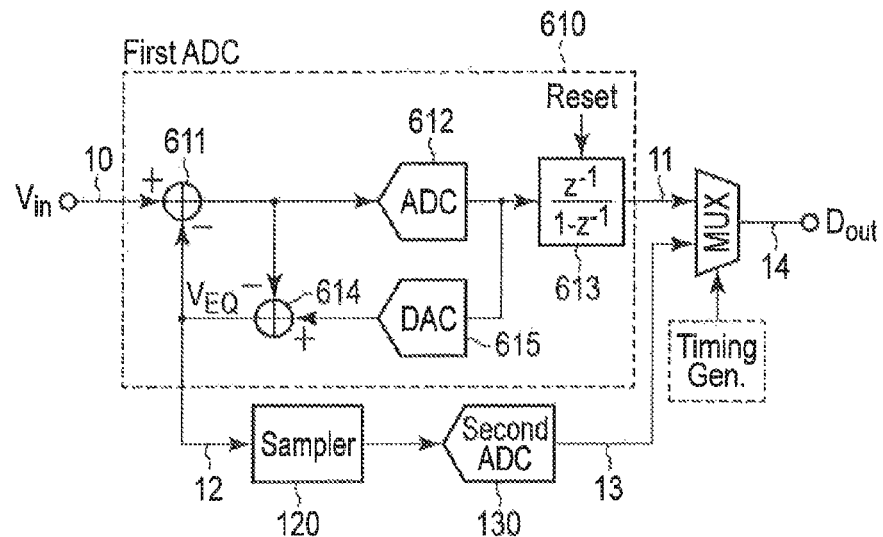
F I G. 12
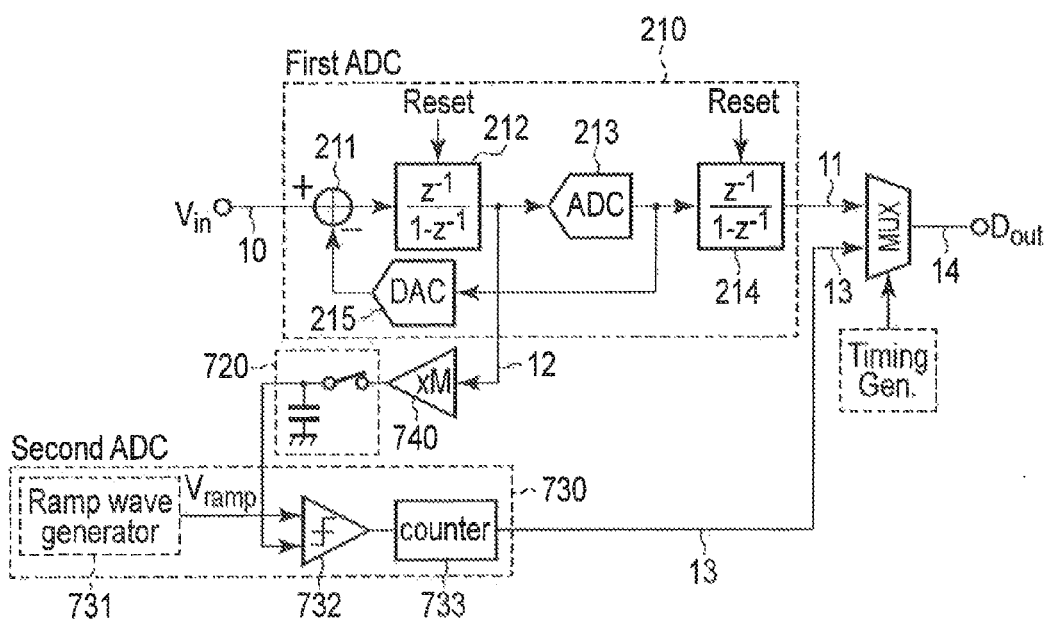
F I G. 13

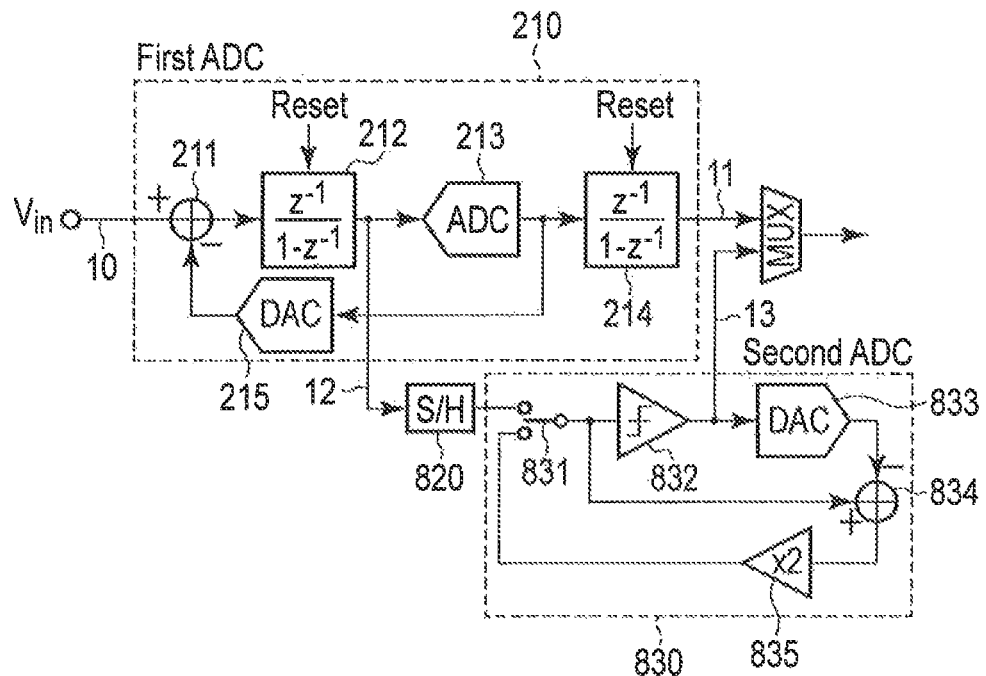
F I G. 15
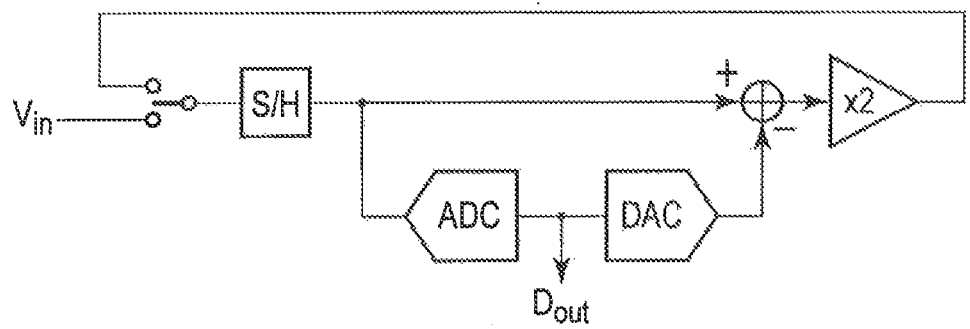
F I G. 16

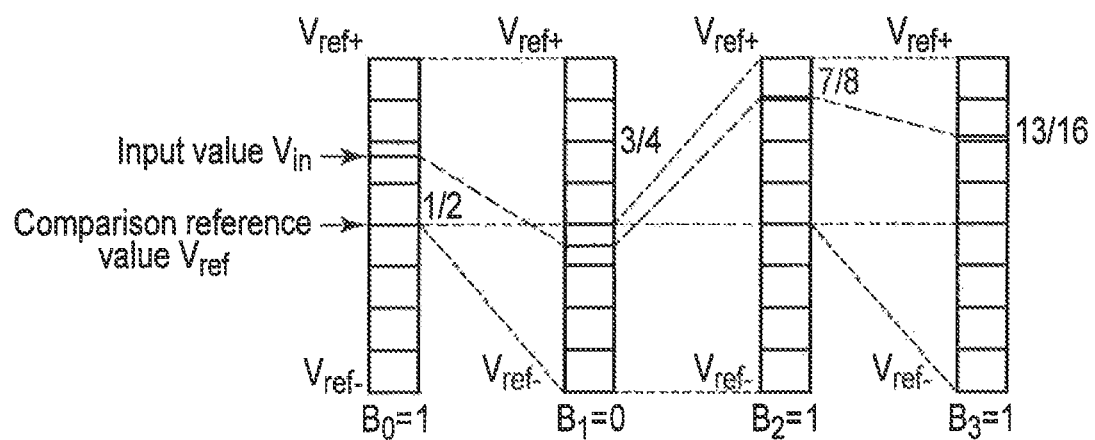
F I G. 17

ANALOG-TO-DIGITAL CONVERTER AND ANALOG-TO-DIGITAL CONVERSION METHOD

CROSS-REFERENCE TO RELATED APPLICATIONS

This application is based upon and claims the benefit of priority from Japanese Patent Application No. 2013-241053, filed Nov. 21, 2013, the entire contents of which are incorporated herein by reference.

FIELD

Embodiments described herein relate generally to an analog-to-digital converter.

BACKGROUND

In order to implement high-resolution analog-to-digital conversion with, for example, an effective resolution exceeding 14 bits, a multisampling ADC (Analog-to-Digital Converter) such as a ΔΣ modulator is used. A general ADC performs sampling once for one input signal. In contrast, a multisampling ADC performs sampling a plurality of times for one input signal and averages the analog-to-digital conversion results in a digital domain. Therefore, the multisampling ADC can achieve a high resolution in analog-to-digital conversion.

The number of times of sampling required for multisampling ADC, however, exponentially increases with respect to the resolution of the multisampling ADC. For example, in order to implement an effective resolution of 14 bits by singly using a ΔΣ modulator incorporating a 1-bit quantizer, it is necessary to perform sampling 1,000 times and 88 times in a primary modulator and a secondary modulator, respectively. An increase in the resolution of the multisampling ADC will lead to a decrease in the operating speed of the multisampling ADC.

BRIEF DESCRIPTION OF THE DRAWINGS

FIG. 5 is a block diagram exemplifying an ADC according to the third embodiment;

FIG. 6 is a block diagram exemplifying an ADC according to the fourth embodiment;

FIG. 8 is a block diagram exemplifying an ADC according to the fifth embodiment;

FIG. 9 is a block diagram exemplifying an ADC according to the sixth embodiment;

FIG. 12 is a block diagram exemplifying an ADC according to the seventh embodiment;

FIG. 13 is a block diagram exemplifying an ADC according to the eighth embodiment;

FIG. 15 is a block diagram exemplifying an ADC according to the ninth embodiment;

FIG. 16 is a block diagram exemplifying a cyclic ADC; and

FIG. 17 is a block diagram for explaining the operation of the cyclic ADC.

DETAILED DESCRIPTION

Figure 1:
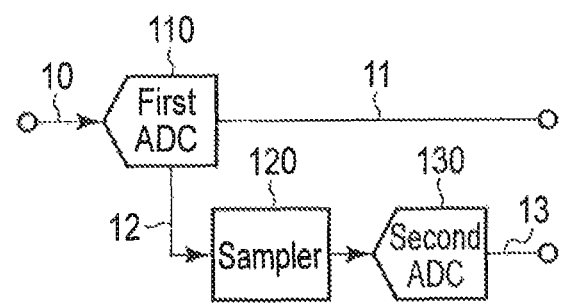
FIG. 1 is a block diagram exemplifying an ADC according to the first embodiment.

Embodiments will be described below with reference to the accompanying drawings.

According to an embodiment, an analog-to-digital converter includes a first analog-to-digital conversion circuit and a second analog-to-digital conversion circuit. The first analog-to-digital conversion circuit performs analog-to-digital conversion of a first input signal to generate an upper-bit digital signal. The second analog-to-digital conversion circuit performs analog-to-digital conversion of a sampled signal to generate a lower-bit digital signal. The sampled signal is obtained by sampling a residual signal corresponding to a residue of the analog-to-digital conversion in the first analog-to-digital conversion circuit. A period during which the second analog-to-digital conversion circuit performs the analog-to-digital conversion of the sampled signal overlaps a period during which a second input signal subsequent to the first input signal is settled.

Note that the same or similar reference numerals denote elements that are the same as or similar to those described above, and a repetitive description of them will be basically omitted.

First Embodiment

As exemplified by FIG. 1, an ADC according to the first embodiment includes a first analog-to-digital conversion circuit 110, a sampler 120, and a second analog-to-digital conversion circuit 130. The ADC in FIG. 1 generates a digital signal 14 including an upper-bit digital signal 11 and a lower-bit digital signal 13 by performing analog-to-digital conversion of an analog signal 10.

The first analog-to-digital conversion circuit 110 corresponds to a multisampling ADC. The first analog-to-digital conversion circuit 110 receives the analog signal 10 after the settling of the analog signal 10. The first analog-to-digital conversion circuit 110 generates the upper-bit digital signal 11 by performing analog-to-digital conversion of the analog signal 10. The first analog-to-digital conversion circuit 110 outputs the upper-bit digital signal 11 to a multiplexer (MUX) (not shown). The first analog-to-digital conversion circuit 110 further outputs a residual signal 12 corresponding to a residue of the analog-to-digital conversion in the first analog-to-digital conversion circuit 110 to the sampler 120.

The sampler 120 receives the residual signal 12 from the first analog-to-digital conversion circuit 110. The sampler 120 obtains a sampled signal by sampling the residual signal 12. The sampler 120 may be, for example, a sample and hold circuit. The sampler 120 outputs the sampled signal to a second analog-to-digital conversion circuit 130.

The second analog-to-digital conversion circuit 130 corresponds to an ADC (e.g., a Nyquist ADC) of a type different from that of a multisampling ADC. The Nyquist ADC can perform analog-to-digital conversion with a sampling count smaller than that for the multisampling ADC. For example, a cyclic ADC as a kind of Nyquist ADC can perform analogto-digital conversion with a resolution of N bits in N cycles. The second analog-to-digital conversion circuit 130 receives a sampled signal from the sampler 120. The second analog-to-digital conversion circuit 130 generates the lower-bit digital signal 13 by performing analog-to-digital conversion of the sampled signal. The second analog-to-digital conversion circuit 130 outputs the lower-bit digital signal 13 to, for example, a multiplexer (not shown).

For example, the multiplexer (not shown) multiplexes the upper-bit digital signal 11 and the lower-bit digital signal 13, and outputs the resultant signal as the digital signal 14.

In this case, the ADC in FIG. 1 can start settling an analog signal subsequent to the current analog signal 10 after sampling of the residual signal 12. That is, this ADC can concurrently execute (i.e., via pipeline processing) analog-to-digital conversion by the second analog-to-digital conversion circuit 130 and the settling of an analog signal subsequent to the current analog signal 10 (and succeeding analog-to-digital conversion by the first analog-to-digital conversion circuit 110).

Figure 2:
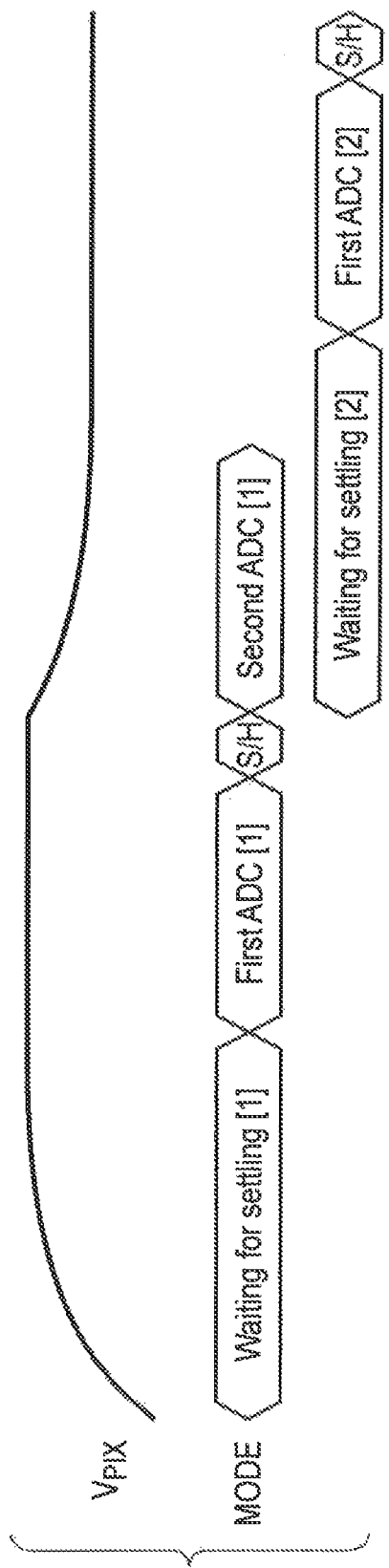
FIG. 2 is a timing chart exemplifying the operation of the ADC in FIG. 1.

More specifically, as exemplified by FIG. 2, the operation of the ADC in FIG. 1 corresponds to a repetition of a series of processes including waiting for the settling of the analog signal 10 ($V_{PIX}$), analog-to-digital conversion of the analog signal 10 by the first analog-to-digital conversion circuit 110, sampling of the residual signal 12 by the sampler 120, and analog-to-digital conversion of a sampled signal by the second analog-to-digital conversion circuit 130. Since sampling by the sampler 120 is inserted between analog-to-digital conversion by the first analog-to-digital conversion circuit 110 and analog-to-digital conversion by the second analog-to-digital conversion circuit 130, this ADC can start settling the subsequent analog signal without waiting for the completion of analog-to-digital conversion by the second analog-to-digital conversion circuit 130. Therefore, this ADC can substantially shorten the time required for analog-to-digital conversion of each analog signal by an overlapping period of the two processes by concurrently executing analog-to-digital conversion by the second analog-to-digital conversion circuit 130 and settling of an analog signal subsequent to the current analog signal 10 (and succeeding analog-to-digital conversion by the first analog-to-digital conversion circuit 110). That is, the ADC can perform high-resolution analog-to-digital conversion at high speed.

As described above, the ADC according to the first embodiment includes, between the first analog-to-digital conversion circuit for upper bits and the second analog-to-digital conversion circuit for lower bits, the sampler which samples a residual signal corresponding to a residue of the analog-to-digital conversion in the first analog-to-digital conversion circuit. This ADC can concurrently execute analog-to-digital conversion by the second analog-to-digital conversion circuit and settling of the subsequent analog signal (and succeeding analog-to-digital conversion by the first analog-to-digital conversion circuit). This ADC can therefore perform high-resolution analog-to-digital conversion at high speed.

Second Embodiment

Figure 3:
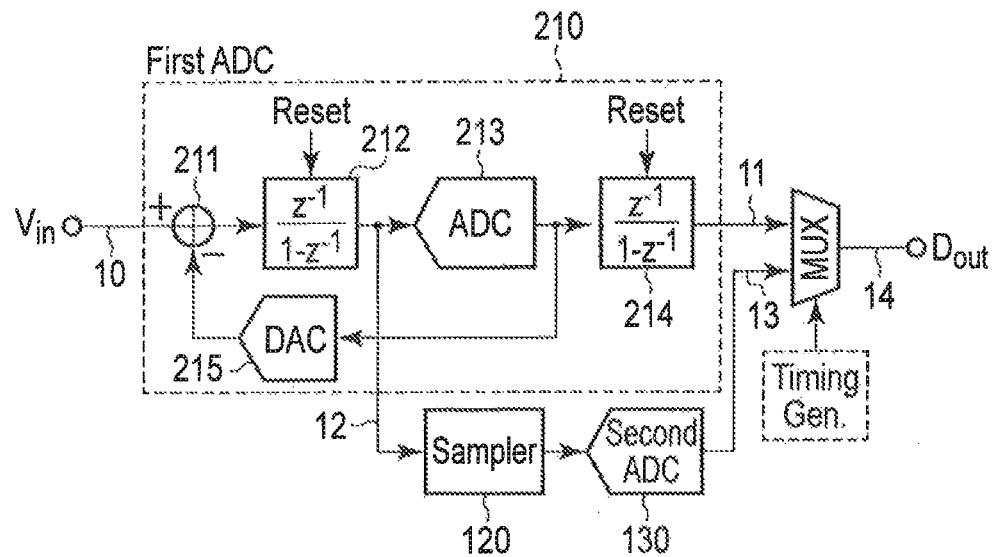
FIG. 3 is a block diagram exemplifying an ADC according to the second embodiment.

As exemplified by FIG. 3, an ADC according to the second embodiment includes a first analog-to-digital conversion circuit 210, a sampler 120, and a second analog-to-digital conversion circuit 130. The ADC in FIG. 3 generates a digital signal 14 ($D_{out}$) including an upper-bit digital signal 11 and a lower-bit digital signal 13 by performing analog-to-digital conversion of an analog signal 10 ($V_{in}$).

The sampler 120 in FIG. 3 differs from the sampler 120 in FIG. 1 in that it receives a residual signal 12 from the first analog-to-digital conversion circuit 210 instead of the first analog-to-digital conversion circuit 110.

The first analog-to-digital conversion circuit 210 corresponds to an incremental $\Delta\Sigma$ modulator. The first analog-to-digital conversion circuit 210 receives the analog signal 10 after the settling of the analog signal 10. The first analog-to-digital conversion circuit 210 generates the upper-bit digital signal 11 by performing analog-to-digital conversion of the analog signal 10. The first analog-to-digital conversion circuit 210 outputs the upper-bit digital signal 11 to a multiplexer. In addition, the first analog-to-digital conversion circuit 210 outputs the residual signal 12 corresponding to a residue of the analog-to-digital conversion in the first analog-to-digital conversion circuit 210 to the sampler 120.

More specifically, the first analog-to-digital conversion circuit 210 includes a subtractor 211, an analog integrator 212, an ADC 213, a digital integrator 214, and a digital-to-analog converter (DAC) 215.

The subtractor 211 receives the analog signal 10, and a feedback signal from the DAC 215. The subtractor 211 generates a difference signal by subtracting the feedback signal from the analog signal 10. The subtractor 211 outputs the difference signal to the analog integrator 212.

The analog integrator 212 receives the difference signal from the subtractor 211. The analog integrator 212 generates an integral signal by integrating the difference signal. The analog integrator 212 outputs the integral signal to the ADC 213. In addition, the analog integrator 212 outputs the residual signal 12 as an integral signal to the sampler 120 upon completion of analog-to-digital conversion by the first analog-to-digital conversion circuit 210. Note that the analog integrator 212 has a reset function, and resets the integral signal at the start of analog-to-digital conversion by the first analog-to-digital conversion circuit 210.

The ADC 213 receives the integral signal from the analog integrator 212. The ADC 213 generates a digital signal by performing analog-to-digital conversion of the integral signal. The ADC 213 outputs the digital signal to the digital integrator 214 and the DAC 215. Note that the ADC 213 may be referred to as the internal ADC 213 to be discriminated from the ADC in FIG. 3.

The digital integrator 214 receives the digital signal from the ADC 213. The digital integrator 214 generates an integral signal by integrating the digital signal. The digital integrator 214 outputs the integral signal as an upper-bit digital signal 11 to the multiplexer upon completion of analog-to-digital conversion by the first analog-to-digital conversion circuit 210. Note that the digital integrator 214 has a reset function, which resets the integral signal at the start of analog-to-digital conversion by the first analog-to-digital conversion circuit 210.

The DAC 215 receives a digital signal from the ADC 213. The DAC 215 generates a feedback signal of the subsequent cycle by performing digital-to-analog conversion of the digital signal. The DAC 215 outputs the feedback signal to the subtractor 211.

Figure 4:
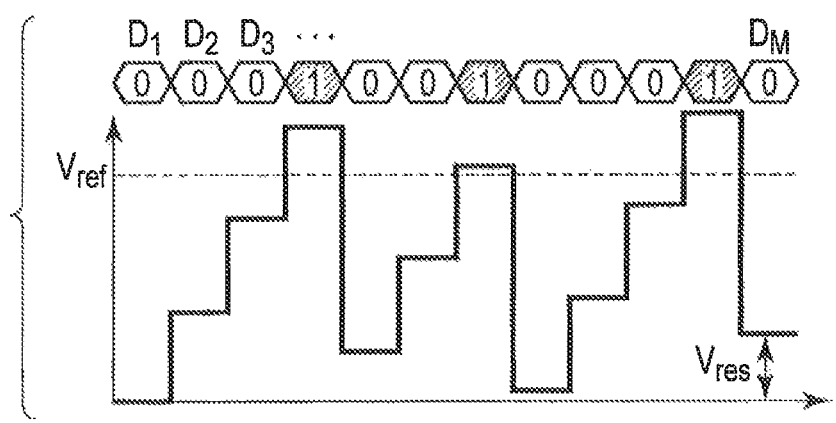
FIG. 4 is a timing chart exemplifying the operation of a first analog-to-digital conversion circuit in FIG. 3.

The first analog-to-digital conversion circuit 210 operates as exemplified by FIG. 4. In the case of FIG. 4, the analog signal 10 is sampled M times (M is an integer equal to or more than 2). Referring to FIG. 4, the ADC 213 generates digital signals $D_1, \ldots, D_M$ through the first to Mth samplings. The integration result (i.e., the total sum) of the digital signals $D_1, \ldots, D_M$ is output as the upper-bit digital signal 11. Referring to FIG. 4, the polygonal line represents a change in the voltage of an integral signal held by the analog integrator 212. The ADC 213 and the DAC 215 use a reference voltage $V_{ref}$. The residual signal 12 has a voltage $V_{res}$.

As shown in FIG. 4, if a digital signal is "1" (in other words, an integral signal exceeds $V_{ref}$), since the voltage $V_{ref}$ of a feedback signal corresponding to the digital signal is higher than that of the analog signal 10, a difference signal having a negative voltage is generated based on the feedback signal. That is, the voltage of the integral signal held by the analog integrator 212 decreases. According to this feedback control, it is possible to make the voltage of an input signal in the ADC 213 fall within a predetermined range.

According to the case of FIG. 4, the following equation holds between the analog signal 10 ($V_{in}$), the sampling count M, the reference voltage $V_{ref}$, the digital signals $D_1, \ldots, D_M$, and the residual signal $V_{res}$.

$$MV_{in} = V_{ref} \sum_{i=1}^{M} D_i + V_{res}$$

As described above, the ADC according to the second embodiment uses an incremental ΔΣ modulator as the first analog-to-digital conversion circuit described in the first embodiment. Therefore, this ADC can obtain effects that are the same as or similar to those of the first embodiment.

Third Embodiment

As exemplified by FIG. 5, an ADC according to the third embodiment includes a first analog-to-digital conversion circuit 210, a sampler 120, a second analog-to-digital conversion circuit 130, and an amplifier 340. The ADC in FIG. 5 generates a digital signal 14 including an upper-bit digital signal 11 and a lower-bit digital signal 13 by performing analog-to-digital conversion of an analog signal 10 ($V_{in}$).

The first analog-to-digital conversion circuit 210 in FIG. 5 differs from the first analog-to-digital conversion circuit 210 in FIG. 3 in that it outputs a residual signal 12 to the multiplexer 340 instead of the sampler 120. Note that an ADC 213 may be referred to as an internal ADC 213 to be discriminated from the ADC in FIG. 5. The sampler 120 in FIG. 5 differs from the sampler 120 in FIG. 3 in that it receives the residual signal amplified by the amplifier 340 instead of the residual signal 12 from the second analog-to-digital conversion circuit 130.

The amplifier 340 receives the residual signal 12 from the first analog-to-digital conversion circuit 210. The amplifier 340 generates an amplified residual signal by amplifying the residual signal 12 $A_{amp}$ (>1) times. The amplifier 340 outputs the amplified residual signal to the sampler 120.

In this case, amplifying the residual signal 12 $A_{amp}$ times reduces the influence of noise generated in the second analog-to-digital conversion circuit 130 to $1/A_{amp}$ times as input referred noise. That is, the accuracy requirement on the second analog-to-digital conversion circuit 130 is alleviated as compared with a case in which the above amplification is not performed.

As described above, the ADC according to the third embodiment includes the amplifier between the first analog-to-digital conversion circuit and the sampler described in the first or second embodiment. Therefore, according to this ADC, the accuracy requirement on the second analog-to-digital conversion circuit is alleviated, and hence it is possible to simplify the second analog-to-digital conversion circuit.

Fourth Embodiment

As exemplified by FIG. 6, an ADC according to the fourth embodiment includes a first analog-to-digital conversion circuit 410 and a second analog-to-digital conversion circuit 130. The ADC in FIG. 6 generates a digital signal 14 ($D_{out}$) including an upper-bit digital signal 11 and a lower-bit digital signal 13 by performing analog-to-digital conversion of an analog signal 10 ($V_{in}$).

The second analog-to-digital conversion circuit 130 in FIG. 6 differs from the second analog-to-digital conversion circuit 130 in FIG. 3 in that it receives a sampled signal from the first analog-to-digital conversion circuit 410 instead of the sampler 120.

The first analog-to-digital conversion circuit 410 corresponds to an incremental ΔΣ modulator. The first analog-to-digital conversion circuit 410 can also function as a sampler. The first analog-to-digital conversion circuit 410 receives the analog signal 10 after the settling of the analog signal 10. The first analog-to-digital conversion circuit 410 generates the upper-bit digital signal 11 by performing analog-to-digital conversion of the analog signal 10. The first analog-to-digital conversion circuit 410 outputs the upper-bit digital signal 11 to the multiplexer. In addition, the first analog-to-digital conversion circuit 410 obtains a sampled signal by sampling a residual signal corresponding to a residue of the analog-to-digital conversion in the first analog-to-digital conversion circuit 410. The first analog-to-digital conversion circuit 410 then outputs the sampled signal to the second analog-to-digital conversion circuit 130.

More specifically, the first analog-to-digital conversion circuit 410 includes a subtractor 211, an analog integrator 212, an ADC 213, a digital integrator 214, a DAC 215, and a switch 416 ($SW_1$). The first analog-to-digital conversion circuit 410 differs from the first analog-to-digital conversion circuit 210 in FIG. 3 in that the switch 416 is inserted between the subtractor 211 and the analog integrator 212. That is, while the switch 416 is on, the first analog-to-digital conversion circuit 410 is almost equivalent to the first analog-to-digital conversion circuit 210 in FIG. 3. Note that an ADC 213 may be referred to as an internal ADC 213 to be discriminated from the ADC in FIG. 6.

The switch 416 is on over the period during which the first analog-to-digital conversion circuit 410 performs the analog-to-digital conversion of the analog signal 10. On the other hand, the switch 416 is turned off when the first analog-to-digital conversion circuit 410 completes analog-to-digital conversion of the analog signal 10. When the switch 416 is turned off, since the input terminal of the analog integrator 212 is opened, an integral signal at this time is held. That is, when the switch 416 is turned off upon completion of analog-to-digital conversion by the first analog-to-digital conversion circuit 410, the analog integrator 212 holds a residual signal as an integral signal at this time. The second analog-to-digital conversion circuit 130 can then generate the lower-bit digital signal 13 by performing analog-to-digital conversion of the residual signal as the above sampled signal held by the analog integrator 212.

Figure 7:
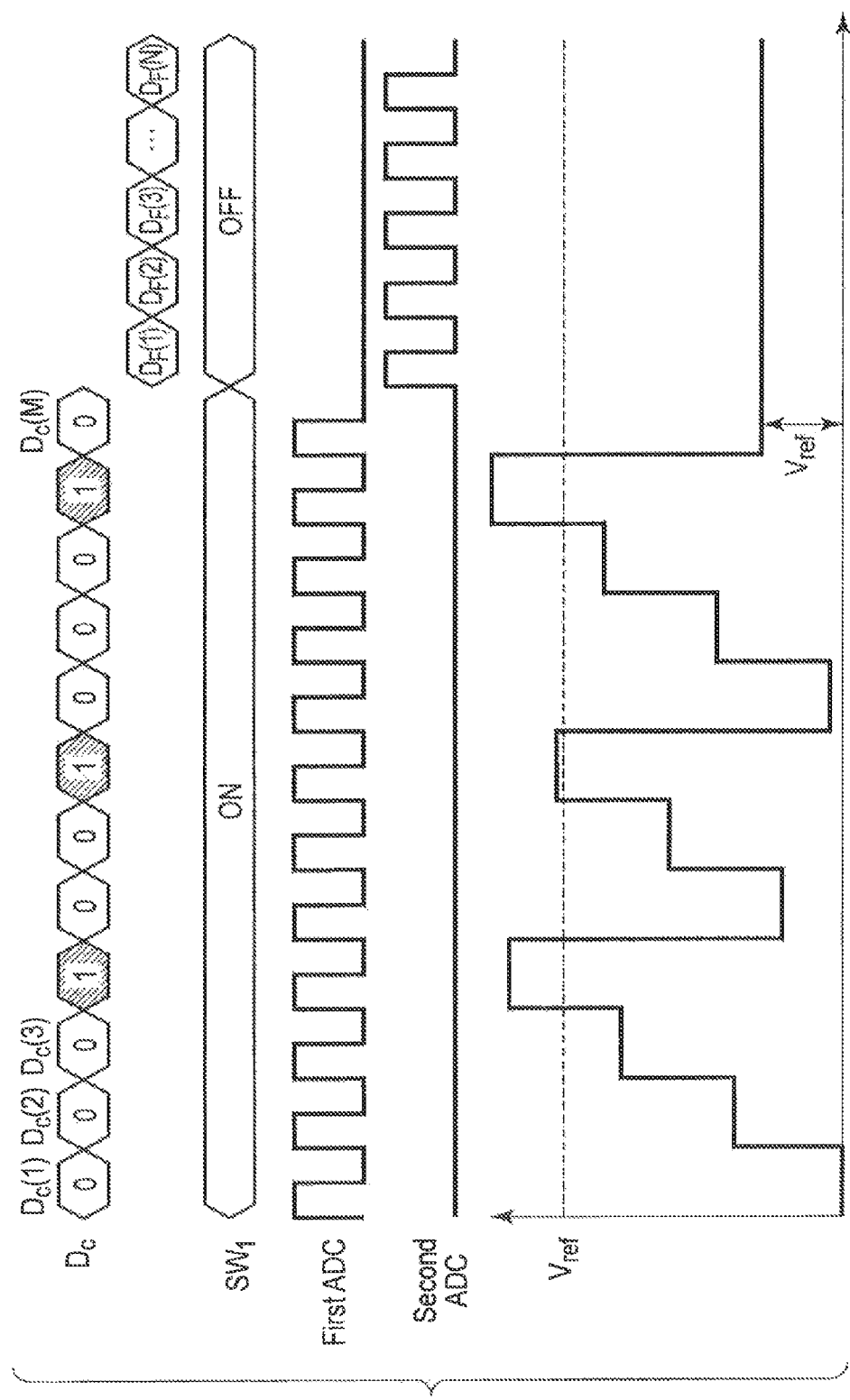
FIG. 7 is a timing chart exemplifying the operation of the ADC in FIG. 6.

The first analog-to-digital conversion circuit 410 operates as exemplified by FIG. 7. In the case of FIG. 7, the analog signal 10 is sampled M times (M is an integer equal to or more than 2), and the sampled signal is sampled N times (N is an integer). Referring to FIG. 7, the ADC 213 generates digital signals $D_1(1), \ldots, D_c(M)$ through the first to Mth samplings. The integration result (i.e., the total sum) of the digital signals $D_1, \ldots, D_M$ is output as the upper-bit digital signal 11. Referring to FIG. 7, the second analog-to-digital conversion circuit 130 generates digital signals $D_F(1), \ldots, D_F(N)$ through the first to Nth samplings. In addition, FIG. 7 shows a change in the state of the switch 416. Referring to FIG. 7, the polygonal line represents a change in the voltage of an integral signal held by the analog integrator 212. The ADC 213 and the DAC 215 use a reference voltage $V_{ref}$. The residual signal 12 has a voltage $V_{res}$.

As shown in FIG. 7, the switch 416 is on over an operation period of the first analog-to-digital conversion circuit 410, and is off over the operation period of the second analog-to-digital conversion circuit 130. The first analog-to-digital conversion circuit 410 functions as an incremental ΔΣ modulator over the period during which the switch 416 is on. The first analog-to-digital conversion circuit 410 (to be precise, the analog integrator 212) functions as a sampler over the period during which the switch 416 is off.

As described above, the ADC according to the fourth embodiment includes the first analog-to-digital conversion circuit for upper bits and the second analog-to-digital conversion circuit for lower bits. This first analog-to-digital conversion circuit time-divisionally functions as an incremental ΔΣ modulator and a sampler. Therefore, the operation this ADC can perform is the same as or similar to that of the ADC according to the second embodiment described above without requiring any dedicated sampler. That is, according to this ADC, it is possible to simplify the arrangement while maintaining the effects that are the same as or similar to those of the second embodiment described above.

Fifth Embodiment

As exemplified by FIG. 8, the ADC according to the fifth embodiment includes a first analog-to-digital conversion circuit 410, a second analog-to-digital conversion circuit 130, and an amplifier 340. The ADC in FIG. 8 generates a digital signal 14 including an upper-bit digital signal 11 and a lower-bit digital signal 13 by performing analog-to-digital conversion of an analog signal 10 ($V_{in}$).

The first analog-to-digital conversion circuit 410 in FIG. 8 differs from the first analog-to-digital conversion circuit 410 in FIG. 6 in that it outputs a sampled signal to the amplifier 340 instead of the second analog-to-digital conversion circuit 130. The second analog-to-digital conversion circuit 130 in FIG. 8 differs from the second analog-to-digital conversion circuit 130 in FIG. 6 in that it receives the sampled signal amplified by the amplifier 340 instead of a sampled signal from the first analog-to-digital conversion circuit 410. Note that an ADC 213 may be referred to as an internal ADC 213 to be discriminated from the ADC in FIG. 8.

The amplifier 340 receives a sampled signal from the first analog-to-digital conversion circuit 410. The amplifier 340 generates an amplified sampled signal by amplifying the sampled signal $A_{amp}$ times. The amplifier 340 outputs the amplified sampled signal to the second analog-to-digital conversion circuit 130.

In this case, amplifying the sampled signal $A_{amp}$ times reduces the influence of noise generated in the second analog-to-digital conversion circuit 130 to $1/A_{amp}$ times as input referred noise. That is, the accuracy requirement on the second analog-to-digital conversion circuit 130 is alleviated as compared with a case in which the above amplification is not performed.

As described above, the ADC according to the fifth embodiment includes the amplifier between the first analog-to-digital conversion circuit and the second analog-to-digital conversion circuit described in the fourth embodiment. Therefore, according to this ADC, the accuracy requirement on the second analog-to-digital conversion circuit is alleviated, and hence it is possible to simplify the second analog-to-digital conversion circuit.

Sixth Embodiment

An ADC according to the sixth embodiment can be applied to, for example, a CMOS (Complementary Metal Oxide Semiconductor) image sensor. An ADC for a CMOS image sensor needs to perform analog-to-digital conversion of the difference signal between two analog signals called a reset signal and a set signal to generate one pixel value data. That is, in this embodiment, an input analog signal corresponds to the difference signal between the first analog signal called a reset signal and the second analog signal called a set signal.

As exemplified by FIG. 9, the ADC according to the sixth embodiment includes a first analog-to-digital conversion circuit 510 and a second analog-to-digital conversion circuit 130. The ADC in FIG. 9 generates a digital signal 14 ($D_{out}$) including an upper-bit digital signal 11 and a lower-bit digital signal 13 by performing analog-to-digital conversion of an analog signal 10 ($V_{in}$).

The first analog-to-digital conversion circuit 510 corresponds to an incremental ΔΣ modulator. Like the first analog-to-digital conversion circuit 410 in FIG. 6, the first analog-to-digital conversion circuit 510 can also function as a sampler. The first analog-to-digital conversion circuit 510 receives the first analog signal after the settling of the first analog signal (which will also be referred to as a reset signal $V_R$). The first analog-to-digital conversion circuit 510 performs analog-to-digital conversion of the first analog signal. Thereafter, the first analog-to-digital conversion circuit 510 receives the second analog signal after the settling of the second analog signal (which will also be referred to as a set signal $V_S$). The first analog-to-digital conversion circuit 510 performs analog-to-digital conversion of the second analog signal. The first analog-to-digital conversion circuit 510 generates the upper-bit digital signal 11 corresponding to the analog-to-digital conversion result of the difference signal between the first and second analog signals by computing the analog-to-digital conversion results of the first and second analog signals. The first analog-to-digital conversion circuit 510 outputs the upper-bit digital signal 11 to a multiplexer. In addition, the first analog-to-digital conversion circuit 510 obtains a sampled signal by sampling a residual signal corresponding to a residue of the analog-to-digital conversion in the first analog-to-digital conversion circuit 510. The first analog-to-digital conversion circuit 510 then outputs the sampled signal to the second analog-to-digital conversion circuit 130.

More specifically, the first analog-to-digital conversion circuit 510 includes a subtractor 211, an analog integrator 212, an ADC 213, a digital integrator 214, a DAC 215, a switch 416 ($SW_1$), a sign selector 517, and a multiplier 518.

The subtractor 211 in FIG. 9 differs from the subtractor 211 in FIG. 6 in that it outputs a difference signal to the multiplier 518 instead of the analog integrator 212. The analog integrator 212 in FIG. 9 differs from the analog integrator 212 in FIG. 6 in that it receives a product signal from the multiplier 518 via the switch 416 instead of a difference signal from the subtractor 211. Note that the ADC 213 may be referred to as the internal ADC 213 to be discriminated from the ADC in FIG. 9.

The sign selector 517 selects signs corresponding to the polarities of the first and second analog signals. More specifically, the sign selector 517 selects a positive sign (+1) for the first analog signal as the reset signal $V_R$. On the other hand, the sign selector 517 selects a negative sign (−1) for the second analog signal as the set signal $V_S$. The sign selector 517 outputs the selected signs to the multiplier 518.

The multiplier 518 receives a difference signal from the subtractor 211, and signs from the sign selector 517. The multiplier 518 generates a product signal by multiplying the difference signal by the signs. More specifically, the multiplier 518 multiplies the first difference signal based on a reset signal $V_R$ by the positive sign (+1), and the second difference signal based on a set signal $V_S$ by the sign (−1). In other words, the multiplier 518 maintains the sign of the first difference signal based on the reset signal $V_R$, and inverts the sign of the second difference signal based on the set signal $V_S$. The multiplier 518 outputs the product signal to the analog integrator 212 via the switch 416.

Figure 10:
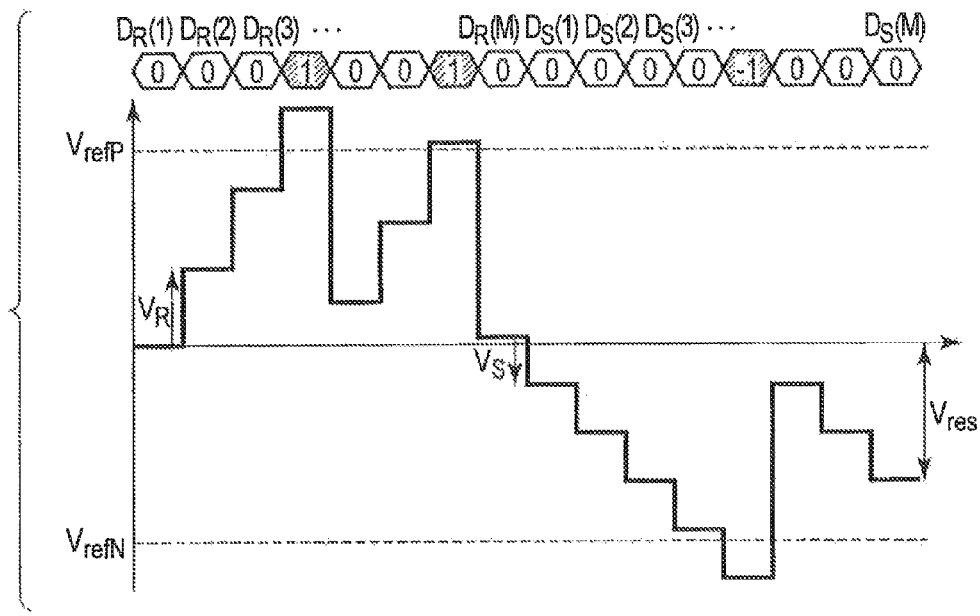
FIG. 10 is a timing chart exemplifying the operation of a first analog-to-digital conversion circuit in FIG. 9.

The first analog-to-digital conversion circuit 510 operates as exemplified by FIG. 10. In the case of FIG. 10, the reset signal $V_R$ and the set signal $V_S$ each are sampled M times (M is an integer equal to or more than 2).

Referring to FIG. 10, the ADC 213 generates digital signals $D_R(1), \ldots, D_R(M)$ through the first to Mth samplings of the reset signal $V_R$. The ADC 213 generates digital signals $D_S(1), \ldots, D_S(M)$ through the first to Mth samplings of the set signal $V_S$. The integration results (i.e., the total sums) of the digital signals $D_R(1), \ldots, D_R$ and $D_S(1), \ldots, D_S$ are output as the upper-bit digital signals 11. Referring to FIG. 10, the polygonal line represents a change in the voltage of an integral signal held by the analog integrator 212. The ADC 213 and the DAC 215 use reference voltages $V_{refP}$ and $V_{refN}$. The residual signal 12 has a voltage $V_{res}$.

As shown in FIG. 10, in a sampling period of the reset signal $V_R$, when the digital signal is "1" (in other words, the integral signal exceeds $V_{refP}$), since the voltage $V_{refP}$ of a feedback signal corresponding to the digital signal is higher than the voltage of the first analog signal, a product signal having a negative voltage is generated based on the feedback signal. That is, the voltage of the integral signal held by the analog integrator 212 decreases. According to this feedback control, it is possible to make the voltages of input signals in the ADC 213 fall within a predetermined range. Likewise, as shown in FIG. 10, in a sampling period of the set signal $V_S$, when the digital signal is "−1" (in other words, the integral signal becomes lower than $V_{refN}$), since the voltage $V_{refN}$ of a feedback signal corresponding to the digital signal is higher than the voltage of the second analog signal, a product signal having a positive voltage is generated based on the feedback signal. That is, the voltage of the integral signal held by the analog integrator 212 increases. According to this feedback control, it is possible to make the voltages of input signals in the ADC 213 fall within a predetermined range.

According to the case of FIG. 10, the following equation holds between the first analog signal $V_R$, the second analog signal $V_S$, the sampling count M, the reference voltages $V_{refP}$ and $V_{refN}$, the digital signals $D_R(1), \ldots, D_R(M)$ and $D_S(1), \ldots, D_S(M)$, and the residual signal $V_{res}$.

$$MV_R - MV_S = V_{refP}\sum_{i=1}^{M} D_R(i) + V_{refN}\sum_{i=1}^{M} D_S(i) + V_{res}$$

Figure 11:
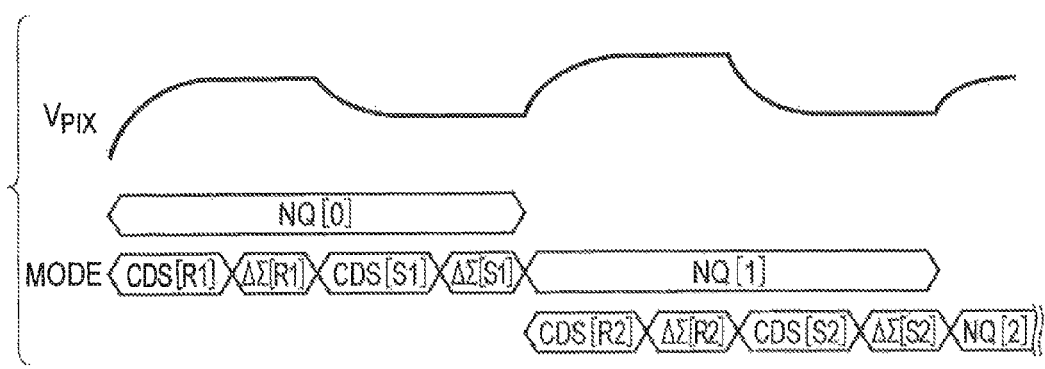
FIG. 11 is a timing chart exemplifying the operation of the ADC in FIG. 9.

As exemplified by FIG. 11, the operation of the ADC in FIG. 9 corresponds to a repetition of a series of processes including analog-to-digital conversion of the first analog signal $V_R$ by the first analog-to-digital conversion circuit 510, analog-to-digital conversion of the second analog signal $V_S$ by the first analog-to-digital conversion circuit 510, and analog-to-digital conversion of a residual signal by the second analog-to-digital conversion circuit 130. Although not shown, the sampling of a residual signal by the first analog-to-digital conversion circuit 510 is inserted between analog-to-digital conversion of the second analog signal $V_S$ by the first analog-to-digital conversion circuit 510 and analog-to-digital conversion of a residual signal by the second analog-to-digital conversion circuit 130. Therefore, this ADC can start settling the subsequent analog signal (that is, the subsequent reset signal and set signal) without waiting for the completion of analog-to-digital conversion by the second analog-to-digital conversion circuit 130. Therefore, this ADC can shorten the time required for analog-to-digital conversion of each analog signal by an overlapping period of the two processes by concurrently executing analog-to-digital conversion by the second analog-to-digital conversion circuit 130 and settling of an analog signal subsequent to the analog signal 10 (and succeeding analog-to-digital conversion by the first analog-to-digital conversion circuit 510). That is, the ADC can perform high-resolution analog-to-digital conversion at high speed.

In addition, since the first analog-to-digital conversion circuit 510 in FIG. 9 performs analog-to-digital conversion of each of a reset signal and a set signal, it is possible to assign a long time for analog-to-digital conversion by the second analog-to-digital conversion circuit 130. More specifically, the magnitude of the time required for analog-to-digital conversion by the second analog-to-digital conversion circuit 130 does not influence the operating speed of the ADC in FIG. 9 unless the time required for analog-to-digital conversion by the second analog-to-digital conversion circuit 130 exceeds the sum of the times required for the settling of a reset signal, analog-to-digital conversion of the reset signal by the first analog-to-digital conversion circuit 510, the settling of a set signal, analog-to-digital conversion of the set signal by the first analog-to-digital conversion circuit 510, and the sampling of a residual signal.

As described above, the ADC according to the sixth embodiment includes the first analog-to-digital conversion circuit for upper bits and the second analog-to-digital conversion circuit for lower bits. This ADC concurrently executes analog-to-digital conversion by the second analog-to-digital conversion circuit and settling of the subsequent analog signal (and succeeding analog-to-digital conversion by the first analog-to-digital conversion circuit). This ADC can therefore perform high-resolution analog-to-digital conversion at high speed. In addition, according to the ADC, it is possible to assign a long time to analog-to-digital conversion by the second analog-to-digital conversion circuit because the second analog-to-digital conversion circuit concurrently executes analog-to-digital conversion of the residual signal with analog-to-digital conversion of two analog signals called a reset signal and a set signal. That is, the operating speed required for the second analog-to-digital conversion circuit can be reduced.

Seventh Embodiment

As exemplified by FIG. 12, an ADC according to the seventh embodiment includes a first analog-to-digital conversion circuit 610, a sampler 120, and a second analog-to-digital conversion circuit 130. The ADC in FIG. 12 generates a digital signal 14 ($D_{out}$) including an upper-bit digital signal 11 and a lower-bit digital signal 13 by performing analog-to-digital conversion of an analog signal 10 ($V_{in}$).

The sampler 120 in FIG. 12 differs from the sampler 120 in FIG. 3 in that it receives the residual signal 12 from the first analog-to-digital conversion circuit 610 instead of the first analog-to-digital conversion circuit 210.

The first analog-to-digital conversion circuit 610 corresponds to an error feedback ΔΣ modulator. The first analog-to-digital conversion circuit 610 receives the analog signal 10 after the settling of the analog signal 10. The first analog-to-digital conversion circuit 610 generates the upper-bit digital signal 11 by performing analog-to-digital conversion of the analog signal 10. The first analog-to-digital conversion circuit 610 outputs the upper-bit digital signal 11 to a multiplexer. In addition, the first analog-to-digital conversion circuit 610 outputs the residual signal 12 corresponding to a residue of the analog-to-digital conversion in the first analog-to-digital conversion circuit 610 to the sampler 120.

More specifically, the first analog-to-digital conversion circuit 610 includes a subtractor 611, an ADC 612, a digital integrator 613, a subtractor 614, and a DAC 615.

The subtractor 611 receives the analog signal 10, and a quantization error signal from the subtractor 614. The subtractor 611 generates a difference signal by subtracting a quantization error signal $V_{EQ}$ from the analog signal 10. The subtractor 611 outputs the difference signal to the ADC 612 and the subtractor 614.

The ADC 612 receives the difference signal from the subtractor 611. The ADC 612 generates a digital signal by performing analog-to-digital conversion of the difference signal. The ADC 612 outputs the digital signal to the digital integrator 613 and the DAC 615. Note that the ADC 612 may be referred to as the internal ADC 612 to be discriminated from the ADC in FIG. 12. The following equation holds between the digital signal (D), the analog signal 10 ($V_{in}$), and the quantization error signal $V_{EQ}$.

$$D=V_{in}+(1-z^{-1})V_{EQ}$$

The digital integrator 613 receives a digital signal from the ADC 612. The digital integrator 613 generates an integral signal by integrating the digital signal. The digital integrator 613 outputs the integral signal as the upper-bit digital signal 11 to the multiplexer upon completion of analog-to-digital conversion by the first analog-to-digital conversion circuit 610. Note that the digital integrator 613 has a reset function, and resets the integral signal at the start of analog-to-digital conversion by the first analog-to-digital conversion circuit 610.

The DAC 615 receives a digital signal from the ADC 612. The DAC 615 generates an analog signal by performing analog-to-digital conversion of the digital signal. The DAC 615 outputs the analog signal to the subtractor 614.

The subtractor 614 receives the difference signal from the subtractor 611, and the analog signal from the DAC 615. The subtractor 614 generates a quantization error signal by subtracting the difference signal from the analog signal. The subtractor 614 outputs the quantization error signal to the subtractor 611. In addition, the subtractor 614 outputs the quantization error signal as the residual signal 12 to the sampler 120 upon completion of analog-to-digital conversion by the first analog-to-digital conversion circuit 610.

As described above, the ADC according to the seventh embodiment uses an error feedback ΔΣ modulator as the first analog-to-digital conversion circuit described in the first embodiment. According to this ADC, it is possible to obtain the same effects as, or effects similar to those of the first embodiment.

Eighth Embodiment

As exemplified by FIG. 13, an ADC according to the eighth embodiment includes a first analog-to-digital conversion circuit 210, a sample and hold circuit 720, a second analog-to-digital conversion circuit 730, and an amplifier 740. The ADC in FIG. 13 generates a digital signal 14 ($D_{out}$) including an upper-bit digital signal 11 and a lower-bit digital signal 13 by performing analog-to-digital conversion of an analog signal 10 ($V_{in}$).

The first analog-to-digital conversion circuit 210 in FIG. 13 differs from the first analog-to-digital conversion circuit 210 in FIG. 5 in that it outputs a residual signal 12 to the amplifier 740 instead of the amplifier 340. Note that an ADC 213 may be referred to as an internal ADC 213 to be discriminated from the ADC in FIG. 13.

The amplifier 740 receives the residual signal 12 from the first analog-to-digital conversion circuit 210. The amplifier 740 generates an amplified residual signal by amplifying the residual signal 12 M times. The amplifier 740 outputs the amplified residual signal to the sample and hold circuit 720.

In this case, amplifying the residual signal 12 M (>1) times reduces the influence of noise generated in the second analog-to-digital conversion circuit 730 to 1/M times as input referred noise. That is, the accuracy requirement on the second analog-to-digital conversion circuit 730 is alleviated as compared with a case in which the above amplification is not performed.

The sample and hold circuit 720 receives the amplified residual signal from the amplifier 740. The sample and hold circuit 720 obtains a sampled signal by sampling and holding the amplified residual signal. The sample and hold circuit 720 may be, for example, a sampler of a type different from that of a sample and hold circuit. The sample and hold circuit 720 outputs the sampled signal to the second analog-to-digital conversion circuit 730.

The second analog-to-digital conversion circuit 730 corresponds to a single-slope ADC. The single-slope ADC can be implemented with a smaller area than that for other types of ADCs. In addition, the single-slope ADC consumes less power than other types of ADCs since it does not require an amplifier.

The second analog-to-digital conversion circuit 730 receives a sampled signal from the sample and hold circuit 720. The second analog-to-digital conversion circuit 730 generates the lower-bit digital signal 13 by performing analog-to-digital conversion of the sampled signal. The second analog-to-digital conversion circuit 730 outputs the lower-bit digital signal 13.

More specifically, the second analog-to-digital conversion circuit 730 includes a ramp wave generator 731, a comparator 732, and a counter 733.

Figure 14:
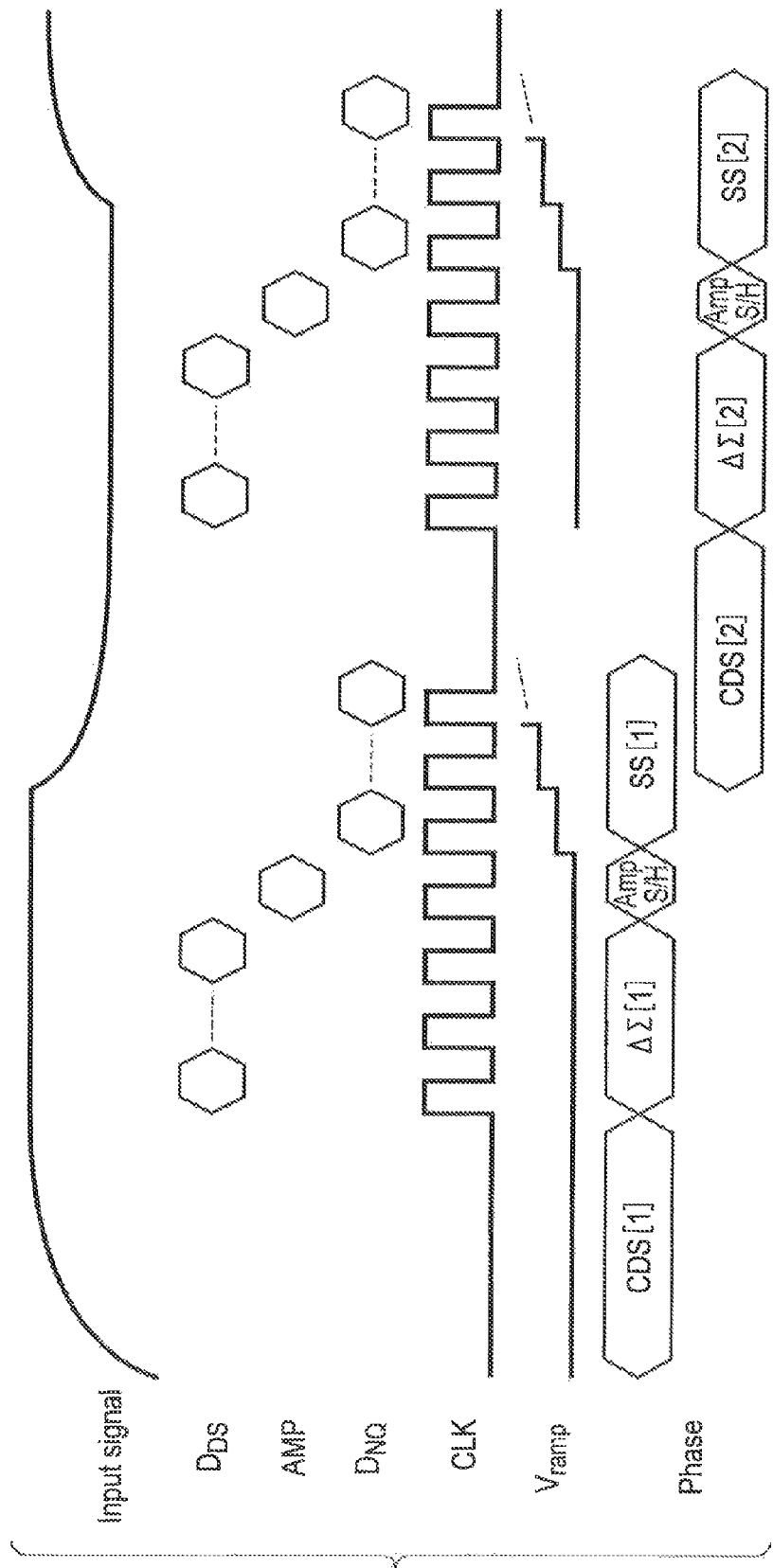
FIG. 14 is a timing chart exemplifying the operation of the ADC in FIG. 13.

The ramp wave generator 731 generates a ramp wave $V_{ramp}$ over an operation period of the second analog-to-digital conversion circuit 730, as shown in FIG. 14. The ramp wave generator 731 outputs the ramp wave to the first input terminal of the comparator 732.

The comparator 732 includes first and second input terminals. The comparator 732 receives a ramp wave from the ramp wave generator 731 via the first input terminal, and a sampled signal from the sample and hold circuit 720 via the second input terminal. The comparator 732 outputs the comparison result signal obtained from the ramp wave and the sampled signal in synchronism with a clock signal (not shown) to the counter 733. For example, the comparator 732 may output a comparison result signal of "1" if the voltage of the sampled signal is equal to or more than that of the ramp wave, and a comparison result signal of "0" otherwise.

The counter 733 receives the comparison result signal from the comparator 732. The counter 733 counts the comparison result signal. The time (the number of clocks) taken to invert the comparison result signal (i.e., to raise the voltage of the ramp wave to a voltage higher than that of the sampled signal) is proportional to the voltage of the sampled signal. Therefore, the count value of the comparison result signal corresponds to the analog-to-digital conversion result of the sampled signal. The counter 733 outputs the count value as the lower-bit digital signal 13 to the multiplexer.

As described above, the ADC according to the eighth embodiment can implement a second analog-to-digital conversion circuit for lower bits with a small area and low power consumption by using a single-slope ADC. In addition, this ADC includes, between the first analog-to-digital conversion circuit for upper bits and the second analog-to-digital conversion circuit for lower bits, the sample and hold circuit which samples and holds a residual signal corresponding to a residue of the analog-to-digital conversion in the first analog-to-digital conversion circuit. The ADC concurrently executes analog-to-digital conversion by the second analog-to-digital conversion circuit and settling of the subsequent analog signal (and succeeding analog-to-digital conversion by the first analog-to-digital conversion circuit). The ADC can therefore perform high-resolution analog-to-digital conversion at high speed. In addition, the ADC includes the amplifier between the first analog-to-digital conversion circuit and the sample and hold circuit. Therefore, according to the ADC, the accuracy requirement on the second analog-to-digital conversion circuit is alleviated, and hence it is possible to simplify the second analog-to-digital conversion circuit.

Ninth Embodiment

As exemplified by FIG. 15, an ADC according to the ninth embodiment includes a first analog-to-digital conversion circuit 210, a sample and hold circuit 820, and a second analog-to-digital conversion circuit 830. The ADC in FIG. 15 generates a digital signal 14 including an upper-bit digital signal 11 and a lower-bit digital signal 13 by performing analog-to-digital conversion of an analog signal 10 ($V_{in}$).

The first analog-to-digital conversion circuit 210 in FIG. 15 differs from the first analog-to-digital conversion circuit 210 in FIG. 3 in that it outputs a residual signal 12 to the sample and hold circuit 820 instead of a sampler 120. Note that an ADC 213 may be referred to as an internal ADC 213 to be discriminated from the ADC in FIG. 15.

The sample and hold circuit 820 receives the residual signal 12 from the first analog-to-digital conversion circuit 210. The sample and hold circuit 820 obtains a sampled signal by sampling and holding the residual signal 12. The sample and hold circuit 820 may be replaced by a sampler of a type different from that of a sample and hold circuit. The sample and hold circuit 820 outputs the sampled signal to the second analog-to-digital conversion circuit 830.

The second analog-to-digital conversion circuit 830 corresponds to a cyclic ADC. The cyclic ADC can perform analog-to-digital conversion at high speed. More specifically, the cyclic ADC performs analog-to-digital conversion with a resolution of N bits in N cycles. In addition, since the cyclic ADC performs analog-to-digital conversion with a resolution of N bits as exemplified by FIG. 17 by repeatedly operating a unit circuit exemplified by FIG. 16 over N cycles, even an increase in resolution hardly increases the mounting area.

The second analog-to-digital conversion circuit 830 receives a sampled signal from the sample and hold circuit 820. The second analog-to-digital conversion circuit 830 generates the lower-bit digital signal 13 by performing analog-to-digital conversion of the sampled signal. The second analog-to-digital conversion circuit 830 outputs the lower-bit digital signal 13.

More specifically, the second analog-to-digital conversion circuit 830 includes a selector 831, an ADC 832, a DAC 833, a subtractor 834, and an amplifier 835.

The selector 831 includes first and second input terminals. The selector 831 receives a sampled signal from the sample and hold circuit 820 via the first input terminal, and a feedback signal from the amplifier 835 via the second input terminal. The selector 831 obtains a selection signal by selecting one of these two input signals. More specifically, the selector 831 selects the sampled signal in the first cycle, and the feedback signal in the second or subsequent cycle. The selector 831 outputs the selection signal to the ADC 832. If the second analog-to-digital conversion circuit 830 also operates in the subsequent cycle, the selector 831 needs to also output the selection signal to the subtractor 834.

The ADC 832 receives the selection signal from the selector 831. The ADC 832 generates a digital signal by performing analog-to-digital conversion of the selection signal. The ADC 832 outputs the digital signal to the multiplexer. This digital signal corresponds to a 1-bit digital signal of the lower-bit digital signal 13. If the second analog-to-digital conversion circuit 830 also operates in the subsequent cycle, the ADC 832 needs to also output the digital signal to the DAC 833. Note that the ADC 832 may be referred to as the internal ADC 832 to be discriminated from the ADC in FIG. 15.

The DAC 833 receives the digital signal from the ADC 832. The DAC 833 generates an analog signal by performing digital-to-analog conversion of the digital signal. The DAC 833 outputs the analog signal to the subtractor 834.

The subtractor 834 receives the selection signal from the selector 831, and the analog signal from the DAC 833. The subtractor 834 generates a residual signal corresponding to a residue of the analog-to-digital conversion in the ADC 832 by subtracting the analog signal from the selection signal. The subtractor 834 outputs the residual signal to the amplifier 835.

The amplifier 835 receives the residual signal from the subtractor 834. The amplifier 835 generates a feedback signal by amplifying the residual signal twice. The amplifier 835 outputs the feedback signal to the second input terminal of the selector 831.

That is, the second analog-to-digital conversion circuit 830 generates an MSB (Most Significant Bit) digital signal of the lower-bit digital signal 13 by comparing the voltage of the sampled signal with a reference voltage in the first cycle. In addition, the second analog-to-digital conversion circuit 830 generates an SSB (Second Significant Bit) digital signal of the lower-bit digital signal 13 by comparing the above reference voltage with the voltage obtained by doubling the voltage of the residual signal, generated in the first cycle, in the second cycle. Likewise, in the Nth cycle, the second analog-to-digital conversion circuit 830 generates an LSB (Least Significant Bit) digital signal of the lower-bit digital signal 13 by comparing the above reference voltage with the voltage obtained by doubling the residual signal generated in the (N−1)th cycle.

As described above, the ADC according to the ninth embodiment can make the second analog-to-digital conversion circuit for lower bits operate at high speed by using a cyclic ADC. This ADC includes, between the first analog-to-digital conversion circuit for upper bits and the second analog-to-digital conversion circuit for lower bits, the sample and hold circuit which samples and holds a residual signal corresponding to a residue of the analog-to-digital conversion in the first analog-to-digital conversion circuit. The ADC concurrently executes analog-to-digital conversion by the second analog-to-digital conversion circuit and settling of the subsequent analog signal (and succeeding analog-to-digital conversion by the first analog-to-digital conversion circuit). The ADC can therefore perform high-resolution analog-to-digital conversion at high speed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An analog-to-digital converter comprising:
   a first analog-to-digital conversion circuit which performs analog-to-digital conversion of a first input signal to generate an upper-bit digital signal; and
   a second analog-to-digital conversion circuit which performs analog-to-digital conversion of a sampled signal to generate a lower-bit digital signal, the sampled signal being obtained by sampling a residual signal corresponding to a residue of the analog-to-digital conversion in the first analog-to-digital conversion circuit,
   wherein a period during which the second analog-to-digital conversion circuit performs the analog-to-digital conversion of the sampled signal overlaps a period during which a second input signal subsequent to the first input signal is settled.

2. The converter according to claim 1, further comprising a sampler which samples the residual signal to obtain the sampled signal.

3. The converter according to claim 1, further comprising:
   an amplifier which amplifies the residual signal to generate an amplified residual signal; and
   a sampler which samples the amplified residual signal to obtain the sampled signal.

4. The converter according to claim 1, wherein the first analog-to-digital conversion circuit comprises:
   a subtractor which subtracts a feedback signal from the first input signal to generate a difference signal;
   an analog integrator which integrates the difference signal to generate an integral signal;
   an internal analog-to-digital converter which performs analog-to-digital conversion of the integral signal to generate a digital signal;
   a digital integrator which integrates the digital signal to generate the upper-bit digital signal; and
   a digital-to-analog converter which performs digital-to-analog conversion of the digital signal to generate a feedback signal of a subsequent cycle.

5. The converter according to claim 1, wherein the first analog-to-digital conversion circuit comprises:
   a subtractor which subtracts a feedback signal from the first input signal to generate a difference signal;
   an analog integrator which integrates the difference signal to generate an integral signal;
   an internal analog-to-digital converter which performs analog-to-digital conversion of the integral signal to generate a digital signal;
   a digital integrator which integrates the digital signal to generate the upper-bit digital signal;
   a digital-to-analog converter which performs digital-to-analog conversion of the digital signal to generate a feedback signal of a subsequent cycle; and
   a switch inserted between the subtractor and the analog integrator and which is turned on over a period during which the first analog-to-digital conversion circuit performs the analog-to-digital conversion of the first input signal and turned off upon completion of analog-to-digital conversion of the first input signal by the first analog-to-digital conversion circuit, and
   the analog integrator holds, as the sampled signal, the integral signal at the time when the switch is turned off.

6. The converter according to claim 1, wherein the first input signal corresponds to a difference signal between a first analog signal and a second analog signal, and
   the first analog-to-digital conversion circuit comprises:
   a subtractor which subtracts a feedback signal from the first analog signal and the second analog signal to respectively generate a first difference signal and a second difference signal;
   a multiplier which multiplies the first difference signal by a positive sign and multiplies the second difference signal by a negative sign to generate a product signal;
   an analog integrator which integrates the product signal to generate an integral signal;
   an internal analog-to-digital converter which performs analog-to-digital conversion of the integral signal to generate a digital signal;
   a digital integrator which integrates the digital signal to generate the upper-bit digital signal; and
   a digital-to-analog converter which performs digital-to-analog conversion of the digital signal to generate a feedback signal of a subsequent cycle.

7. An analog-to-digital conversion method comprising:
   performing, by a first analog-to-digital conversion circuit, analog-to-digital conversion of a first input signal to generate an upper-bit digital signal; and
   performing, by a second analog-to-digital conversion circuit, analog-to-digital conversion of a sampled signal to generate a lower-bit digital signal, the sampled signal being obtained by sampling a residual signal corresponding to a residue of the analog-to-digital conversion in the first analog-to-digital conversion circuit,
   wherein a period during which the second analog-to-digital conversion circuit performs the analog-to-digital conversion of the sampled signal overlaps a period during which a second input signal subsequent to the first input signal is settled.

* * * * *